United States Patent

Elsner et al.

[11] Patent Number: 5,939,893
[45] Date of Patent: Aug. 17, 1999

[54] CONTACT PROBE ARRANGEMENT FOR FUNCTIONAL ELECTRICAL TESTING

[75] Inventors: Gerhard Elsner, Kaarst; Johann Greschner, Pliezhausen; Roland Stoehr, Nufringen, all of Germany

[73] Assignee: International Business Machines Corporation, Armonk, N.Y.

[21] Appl. No.: 08/823,262

[22] Filed: Mar. 24, 1997

[30] Foreign Application Priority Data

Jun. 26, 1996 [DE] Germany ............................ 196 25 493

[51] Int. Cl.[6] .................................................. G01R 1/073
[52] U.S. Cl. .......................... 324/761; 324/754; 324/757
[58] Field of Search .................................. 324/754, 757, 324/758, 761, 765, 72.5

[56] References Cited

U.S. PATENT DOCUMENTS

| | | | |
|---|---|---|---|
| 4,622,514 | 11/1986 | Lewis | 324/761 |
| 4,843,315 | 6/1989 | Bayer et al. | 324/756 |
| 5,488,314 | 1/1996 | Brandt et al. | 324/758 |
| 5,818,248 | 10/1998 | St. Onge | 324/761 |

FOREIGN PATENT DOCUMENTS 0 165 331  12/1985  European Pat. Off. .

*Primary Examiner*—Glenn W. Brown

[57] ABSTRACT

A contact probe arrangement for electrical functional testing, including a first stack of perforated plates, a second stack of perforated plates and a plurality of contact probes. The probes are in contact with the second stack of perforated plates, and in communication with the first stack, the probes are arranged and dimensioned such that the probes are capable of lateral buckling and capable of being guided through the first stack. The contact probe arrangement also includes a test card, a counterholding piece attached to the test card, and a pressure plate, the pressure plate movably connected to the test card. The first perforated plate is connected to the second perforated plate such that the first perforated plate is capable of movement toward and away from the second perforated plate and the second perforated plate is connected to the first perforated plate such that the second perforated plate is capable of movement toward and away from the first perforated plate.

20 Claims, 1 Drawing Sheet

5,939,893

CONTACT PROBE ARRANGEMENT FOR FUNCTIONAL ELECTRICAL TESTING

FIELD OF THE INVENTION

The invention relates to a contact probe arrangement for functional electrical testing, and more particularly, to a contact probe arrangement where the contact probes are connected to a first stack of perforated plates permitting lateral buckling and are also connected to a second stack of perforated plates.

BACKGROUND OF THE INVENTION

Contact probe arrangements are useful when testing for breaks and short-circuits in conductor networks of microelectronic components. The electrical testing of microelectronic components, such as circuit boards, ceramic modules or semiconductor chips is usually accomplished using test cards. Increasingly test heads on a membrane base and those based on the buckling beam concept are employed, as described in the European patents 0 165 331 and 0 283 545.

A common objective of all of these concepts is to achieve as uniform a contact as possible, so that all connection points on the component to be tested are subjected to nearly the same mechanical influence.

As a consequence of the tolerances of the adjusting components of the test heads, some deviation from coplanarity arises between the contact surface of the test head and the surface to be tested, which has to be equalized.

Membrane-based test heads have a relatively thin elastic membrane and can thus equalize deviation from coplanarity only to a limited extent, typically only about a few micrometers ($\mu$m), with a maximum of about 3 $\mu$m. With test cards and buckling beam test heads the different lengths of the individual contact elements counteract the objective, subjecting all contact points to equal pressure.

Test cards have the advantage of being able to self adjust over a wider range, a range of about 30 to 50 mm. However, the usefulness of test cards is impaired because the uncertainty in placement in a correct location increases with compensation.

With the buckling beam test concept, the self-compensation depends on the amount and size of superimposed buckling chambers in which the laterally displaceable contact probes are guided. The larger the required compensation, the longer the contact probes become. Since a fast transfer of signals is involved in the testing of electronic components and particularly in the testing of semiconductor chips, the contact element or the contact probes should be as short as possible.

Thus, there remains a need for an apparatus for testing electrical functions which has the ability to tolerate larger variations and also optimizes contact probe size.

SUMMARY OF THE INVENTION

The principal object of the invention is to provide a contact probe arrangement for the electrical functional testing, which exhibits an increased measure of self-compensation with short contact probes.

The contact probe arrangement includes a first stack of perforated plates, in which the contact probes are permitted to bend laterally, a second stack of perforated plates, on or in which the contact probes are fastened, a test card and a pressure plate. The first and second stack of perforated plates are joined so at to be movable to and from one another, the second stack of perforated plates is firmly attached to the pressure plate, the test card is firmly attached to the counterholding means and the pressure plate is movable relative to the test card.

The construction of the contact probe arrangement in accordance with the invention and the movable combination of certain single elements considerably improves the self-compensation of the traditional buckling beam test heads, without extending the contact probe. In this way, the known contacting characteristics of the buckling beam test heads and the signal paths are retained even with larger deviations from coplanarity. The increased mechanical compensation capacity has no impact on the electrical characteristics.

It is advantageous to arrange the pressure plate so that it is movable towards the test card by means of leaf springs. This makes it possible to adjust the contact pressure on the contact surfaces of the components to be tested.

BRIEF DESCRIPTION OF THE DRAWING

The invention is more particularly defined in the following detailed description when taken in conjunction with the drawing which shows.

DETAILED DESCRIPTION OF THE PREFERRED EMBODIMENTS AND BEST MODE

Figure 1:
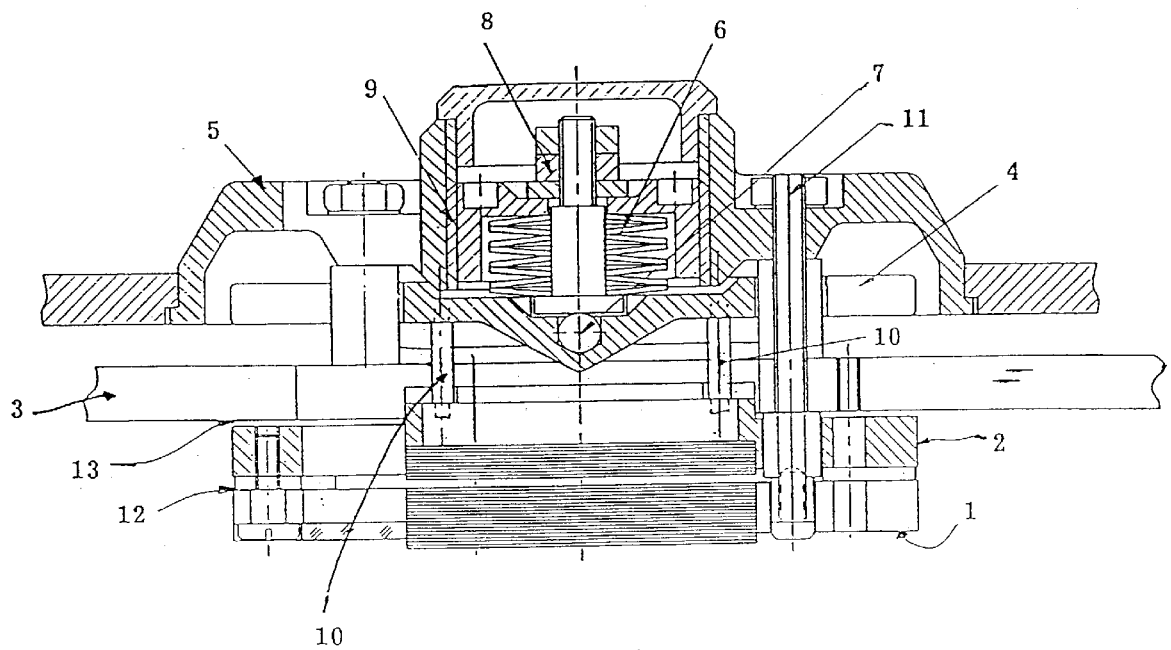
FIG. 1 a cross-sectional view through the contact probe arrangement of the invention.

Referring to the figures in general and FIG. 1 in particular, the cross-section through the contact probe arrangement, 30, in FIG. 1 shows the arrangement of the major components. In a first stack of perforated plates 1, the perforated plates are arranged with their apertures offset in such a way that the contact probes, 1a, 1b, 1c and 1d, can bend out laterally on axial loading. The first stack of perforated plates, 1, serves to guide the contact probes 20a, 20b, 20c and 20d. The contact probes are attached onto or in the second stack of perforated plates 2.

Figure 2:
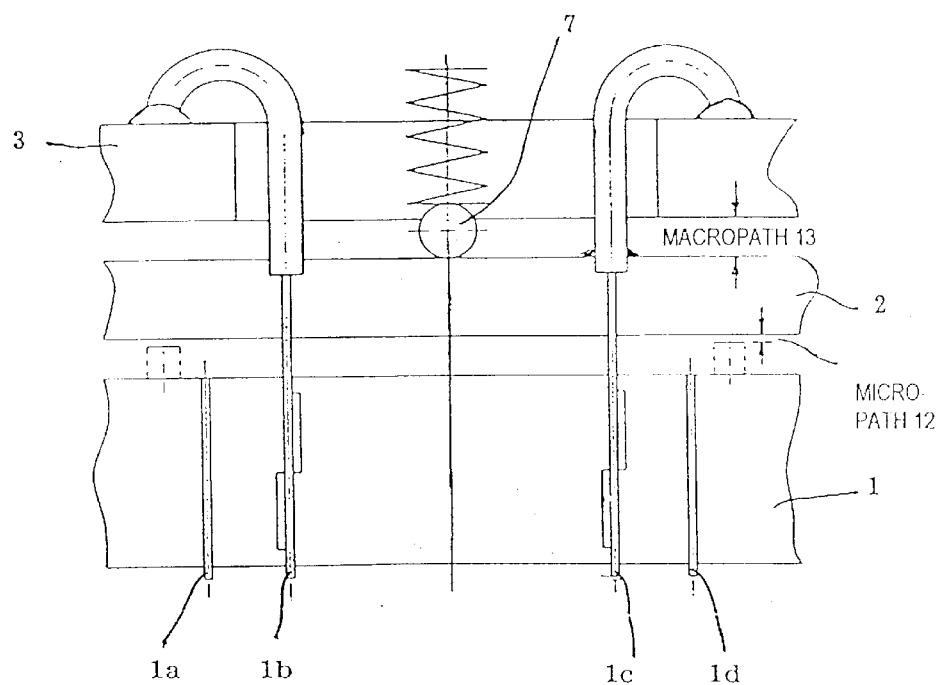
FIG. 2 a cross-section through a part area of the contact probe arrangement shown schematically and enlarged.

The two stacks of perforated plates 1,2 are so interrelated over the contact probes, 1a, 1b, 1c, 1d, that they can move one after another towards and/or away from each other along a path, which is determined by the contact probe. This path is also known as the contact probe buckling path. Characteristically, the path length is in the region of approximately 30–70 $\mu$m. In FIG. 2, this path length 12 is marked as micropath.

The second stack of perforated plates 2 is firmly attached to a pressure plate 4. The fixed attachment is preferably ensured by means of spacing pieces 10.

The test card 3 is firmly attached with a counterholding means 5, preferably by means of bolts 11.

Finally, the pressure plate 4 is arranged so that it is movable in relation to the test card 3. Preferably, the pressure plate 4 is suspended in a floating relationship to the test card 3 by means of several leaf springs 6a. This arrangement of the individual components makes it possible for the first and second stack of perforated plates 1,2 and the pressure plate 4 to move to and fro in relation to the test card 3 within certain limits. The path length thus covered is marked in FIG. 2 as a macropath, 13. The macropath 13 is characteristically in the range of about 200–300 $\mu$m.

The micropath 12 and the macropath 13 are recognizable in that part area of the contact probe arrangement shown enlarged in FIG. 2. Individual contact probes 1a, 1b, 1c, 1d in the first and/or second stack of perforated plates 1,2, as well as the test card 3, are shown. The two stacks of perforated plates 1,2 can move towards or away from each other by the distance marked as the micropath 12. This distance, 12, corresponds to the buckling path of a contact probe, which can bend laterally in the first stack of perforated plates 1 over the distance provided for it. The first and second perforated plates 1,2 can jointly move over the distance marked as macropath 13 on the test card 3.

The possibility, created by the arrangement in accordance with the invention, of travelling over the macropath, increases the self-compensation of the contact probe arrangement by a factor of at least 10, from approximately 30 to approximately 300 μm. For all test heads, which depend on the buckling beam concept, this value is sufficient to equalize any deviation from coplanarity which arises and, thus, to guarantee a uniform contact with the areas of the test surface.

In an advantageous embodiment, like the one shown in FIG. 1, the leaf springs 6a are arranged as a spring unit, 6, in the counterholding means 5 and the spring unit works through a spherical pivot 7 on the pressure plate 4. The adjustable force design of the spring unit 6 with at least one spring adjustor, 8, for adjusting the initial pressure and at least one height adjustor, 9, for height adjustment also make it possible to adjust the contact pressure according to the requirements. In the case of the spring adjustors, these devices preferably take the form of nuts.

The amount of spring pressure to be adjusted depends on the number of contact probes in the test card 3. With e.g. 100 contact probes each with a contact pressure of 0.05 N, the total contact force is 5 N. The spring unit 6 is then adjusted to a slightly higher value.

While the invention has been described in terms of specific embodiments, it is evident in view of the foregoing description that numerous alternative, modifications and variations will be apparent to those skilled in the art. Thus, the invention is intended to encompass all such alternative, modifications and variations which fall within the scope and spirit of the invention and the appended claims.

We claim:

1. A contact probe arrangement for electrical functional testing, comprising:

a first stack of perforated plates;

a second stack of perforated plates;

a plurality of contact probes;

the probes being in contact with the second stack of perforated plates, and being in communication with the first stack of perforated plates, the probes being arranged and dimensioned such that the probes are capable of lateral buckling and guided through the first stack of perforated plates;

a test card;

a counterholding means attached to the test card;

a pressure plate, the pressure plate being movably connected to the test card and the pressure plate in contact with the second stack of perforated plates;

the first stack of perforated plates being connected to the second stack of perforated plates such that the first stack of perforated plates is capable of movement toward and away from the second stack of perforated plates;

the second stack of perforated plates being connected to the first stack of perforated plates such that the second stack of perforated plates is capable of movement toward and away from the first stack of perforated plates.

2. The contact probe arrangement according to claim 1, further comprising spacing pieces, the spacing pieces attaching the pressure plate and the second stack of perforated plates.

3. The contact probe arrangement according to claim 1, further comprising bolts, the bolts attaching the test card to the counterholding means.

4. The contact probe arrangement according to claim 1, further comprising leaf springs; the springs movably connecting the pressure plate to the test card.

5. The contact probe arrangement according to claim 4, further comprising a spherical pivot; the pivot in communication with the pressure plate and the leaf springs; the leaf springs being arranged and dimensioned so as to act as a spring unit in the counterholding means.

6. The contact probe arrangement according to claim 5, further comprising spacing pieces, the spacing pieces attaching the pressure plate and the second stack of perforated plates.

7. The contact probe arrangement according to claim 5, further comprising bolts, the bolts attaching the test card to the counterholding means.

8. The contact probe arrangement according to claim 5, further comprising a height adjustor, the height adjustor being capable of adjusting the height of the spring unit.

9. The contact probe arrangement according to claim 8, further comprising spacing pieces, the spacing pieces attaching the pressure plate and the second stack of perforated plates.

10. The contact probe arrangement according to claim 9, further comprising bolts, the bolts attaching the test card to the counterholding means.

11. The contact probe arrangement according to claim 5, further comprising a spring adjustor, the spring adjustor capable of presetting the pressure supplied by the spring unit to the pressure plate, and the spring unit being adjustable.

12. The contact probe arrangement according to claim 11, wherein the spring adjustor is a nut.

13. The contact probe arrangement according to claim 11, further comprising bolts, the bolts attaching the test card to the counterholding means.

14. The contact probe arrangement according to claim 11, further comprising a height adjustor, the height adjustor being capable of adjusting the height of the spring unit.

15. The contact probe arrangement according to claim 14, further comprising bolts, the bolts attaching the test card to the counterholding means.

16. The contact probe arrangement according to claim 14, further comprising spacing pieces, the spacing pieces attaching the pressure plate and the second stack of perforated plates.

17. The contact probe arrangement according to claim 16, further comprising bolts, the bolts attaching the test card to the counterholding means.

18. The contact probe arrangement according to claim 14, wherein the height adjustor is connected to the counterholding means.

19. The contact probe arrangement according to claim 18, further comprising spacing pieces, the spacing pieces attaching the pressure plate and the second stack of perforated plates.

20. The contact probe arrangement according to claim 19, further comprising bolts, the bolts attaching the test card to the counterholding means.

* * * * *